United States Patent [19]
Yaezawa

[11] Patent Number: 5,377,343
[45] Date of Patent: Dec. 27, 1994

[54] SECURITY CIRCUIT FOR PROTECTING DATA STORED IN AN INTERNAL MEMORY OF A MICROCOMPUTER

[75] Inventor: Katsumi Yaezawa, Yokohama, Japan

[73] Assignee: Kabushiki Kaisha Toshiba, Kawasaki, Japan

[21] Appl. No.: 731,763

[22] Filed: Jul. 18, 1991

[30] Foreign Application Priority Data

Jul. 19, 1990 [JP] Japan .................................. 2-191284

[51] Int. Cl.⁵ ............................................... G11C 7/00
[52] U.S. Cl. ...................................... 395/425; 380/3; 235/382
[58] Field of Search ..................... 395/400, 425; 380/3, 380/25; 235/382, 382.5

[56] References Cited

U.S. PATENT DOCUMENTS

| | | | |
|---|---|---|---|
| 4,654,829 | 3/1987 | Jiang et al. | 365/189.03 |
| 4,757,533 | 7/1988 | Allen et al. | 380/25 |
| 4,864,542 | 9/1989 | Oshima et al. | 365/189.01 |

FOREIGN PATENT DOCUMENTS

| | | |
|---|---|---|
| 58-23398 | 8/1981 | Japan . |
| 58-94195 | 6/1983 | Japan . |
| 62-73350 | 4/1987 | Japan . |
| 62-75851 | 4/1987 | Japan . |

OTHER PUBLICATIONS

Intel 2716 Data Sheet as reproduced In "Microcomputer Hardware Handbook", ELCOMP Publishing, 1982, pp. 244–247.

Pp. 2–4 and 3–10 of FASTCARD III users manual, Thesys Memory Products Corporation, Jul. 1985.

Bursky, "Protect Your EEPROM Data and Gain More Flexibility," *Electronic Design,* vol. 36, No. 12, pp. 43, 44, 46 & 48 (May 1988).

DeFrancesco et al., "Intelligent Non-Volatile Memory for Smart Cards," *IEEE Transactions on Consumer Electronics,* vol. CE-32, No. 3, pp. 604–607.

*Primary Examiner*—David L. Robertson
*Attorney, Agent, or Firm*—Foley & Lardner

[57] ABSTRACT

A security circuit for protecting data stored in an internal memory of a microcomputer has a first memory for storing an externally applied security code and a latch circuit for latching a key code in order to read data stored in the internal memory. A comparator determines whether or not the security code in the first memory and the key code in the latch circuit are in agreement and outputs comparison results for storage in a second memory. A read control circuit uses the comparison results stored in the second memory as the basis for prohibiting reading of data in the internal memory when the security code and the key code are not in agreement, and for using an externally applied output control signal as the basis to control reading of data stored in the internal memory when there is agreement.

9 Claims, 2 Drawing Sheets

SECURITY CIRCUIT FOR PROTECTING DATA STORED IN AN INTERNAL MEMORY OF A MICROCOMPUTER

The present invention relates to a security circuit which protects data that is written in a read only memory (ROM) internal to a microcomputer, and which is used in single-chip microcomputers.

The problem of security of data written to ROM that are internal to single-chip microcomputers has been under investigation for a long time and methods such as prohibiting the reading of data in ROM have been thought of. In the conventional technology, a writing by the user of "0" or "1" in an electrically programmable ROM (EPROM) that stores the (1 bit) security code performs a security operation to operate a security circuit and prohibit the reading of data (programs) inside a ROM.

In this conventional technology, once the security circuit has operated, it is not possible for the data that are stored in the ROM to be read by the user for the purpose of maintenance and management.

SUMMARY OF THE INVENTION

In the light of this problem, the present invention has as an object the provision of a security circuit that enables the user who applied the security, to read data such as programs and the like that are stored in the memory, and that disables reading by other users.

The present invention is a security circuit for the protection of data that is stored in a memory internal to a microcomputer. The security circuit is provided with a first memory to store and input a security code, a latch circuit to latch a key code that is input in order to read the data that is stored in the internal memory, and a comparator circuit to compare whether or not the security code that is stored in the first memory and the key code that is latched by the latch circuit are in agreement. The security circuit according to the invention also has a second memory to store the comparison results compared by the comparator circuit, and a read control circuit that uses the results of comparison stored in the second memory as the basis to prohibit the reading of data stored in the internal memory when the security code and the key code are not in agreement and that uses an externally input output control signal when there is agreement as the basis for controlling the reading of data that is stored in the internal memory.

According to a security circuit of the present invention having the configuration described above, inputting a security code causes that security code to be stored in a non-volatile first memory, for example. Then, the key code to read the data that is stored in the internal memory is input and this key code is latched by the latch circuit. Also, this latched key code is compared in a comparator circuit with a security code which is stored in a non-volatile first memory. The results of this comparison are stored in a non-volatile second memory.

Then, the results of the comparison which are stored in the second memory, are used as the basis to prohibit the reading of data stored in the internal memory when the security code and the key code are not in agreement, and when there is agreement an externally applied output control signal is used as the basis to control the reading of data that are stored in the internal memory. In this way, for as long as the correct key code is not inputted, it is not possible to read that data from the internal memory, and it is possible for the user who has applied the key code to read that data of the program and the like that are stored in the internal memory, but it is not possible for this to be read by other users.

BRIEF DESCRIPTION OF THE DRAWINGS

In the appended drawings.

DETAILED DESCRIPTION OF THE PREFERRED EMBODIMENTS

Figure 1:
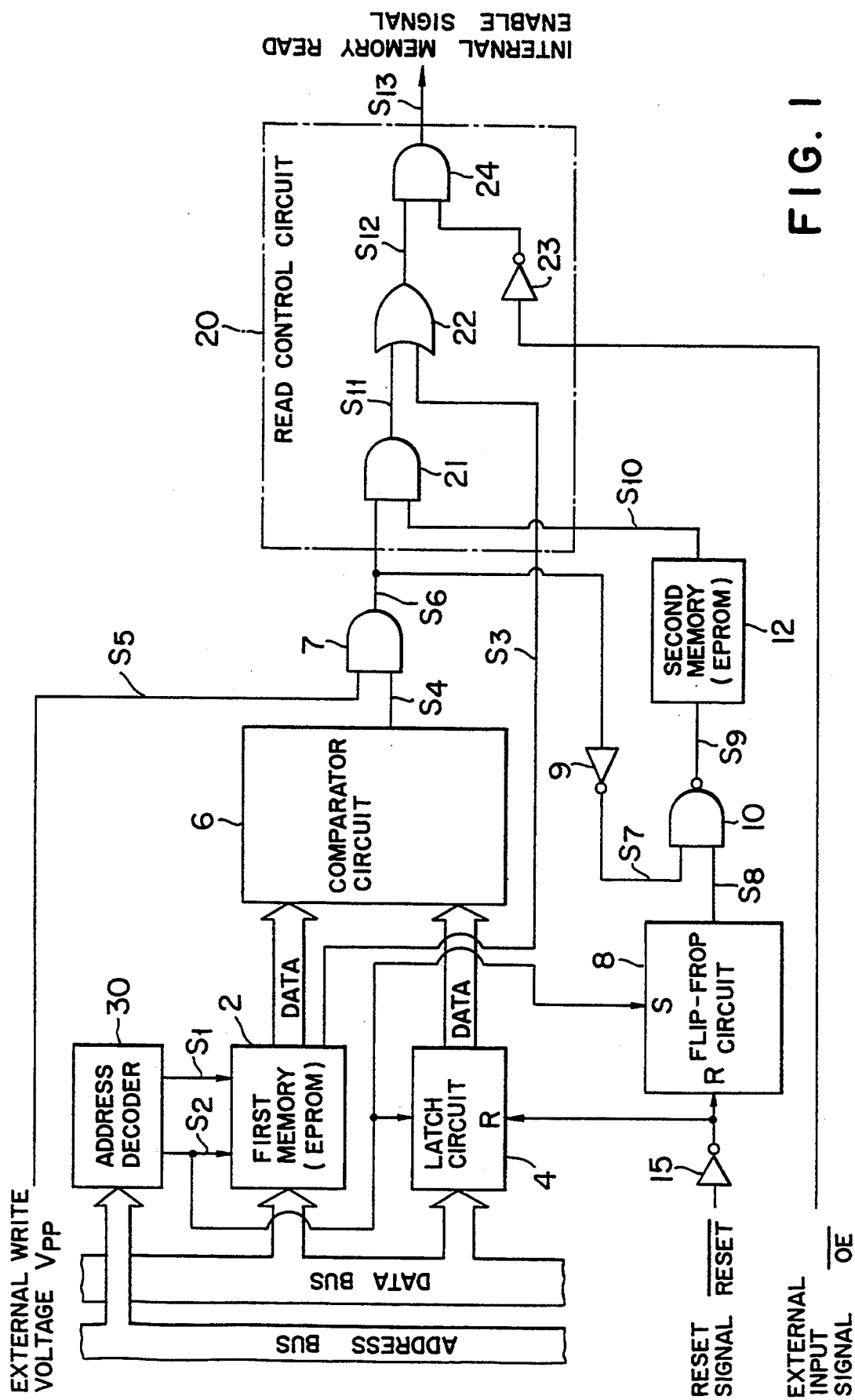
FIG. 1 is a block diagram showing the configuration of a security circuit according to an embodiment of the present invention.

FIG. 1 is a block diagram showing the configuration of a security circuit according to an embodiment of the present invention. The security circuit of this embodiment is provided with a first memory 2, a latch circuit 4, a comparator circuit 6, an AND circuit 7, a flip-flop 8, a NOT circuit 9, a NAND circuit 10, a second memory 12 and a read control circuit 20. The data that are stored in an internal memory such as an EPROM (not indicated in the figure) that is internal to the microcomputer or the like, is protected. The first memory 2 is for example, a non-volatile memory comprising an EPROM and stores the security code that is inputted from external. The latch circuit 4 latches the key code that is input, in order to read the data that are stored in the memory internal to the microcomputer or the like. The comparator circuit 6 compares the key code that is latched to the latch circuit 4, with the security code that is stored in the first memory 2. The second memory 12 is a non-volatile memory comparing a 1-bit EPROM for example, and stores the comparison results that were compared by the comparator circuit 6. The read control circuit 20 has an AND circuit 21, an OR circuit 22, a NOT circuit 23 and an AND circuit 24, and controls the reading of data that is stored in the memory (EPROM) internal to the microcomputer not indicated in the figure. Numeral 15 shows a NOT circuit that supplies to a reset terminal R of the flip-flop 8 a reset signal $\overline{RESET}$ having a negative level, and numeral 30 indicates an address decoder for decoding coded address data.

Figure 2:
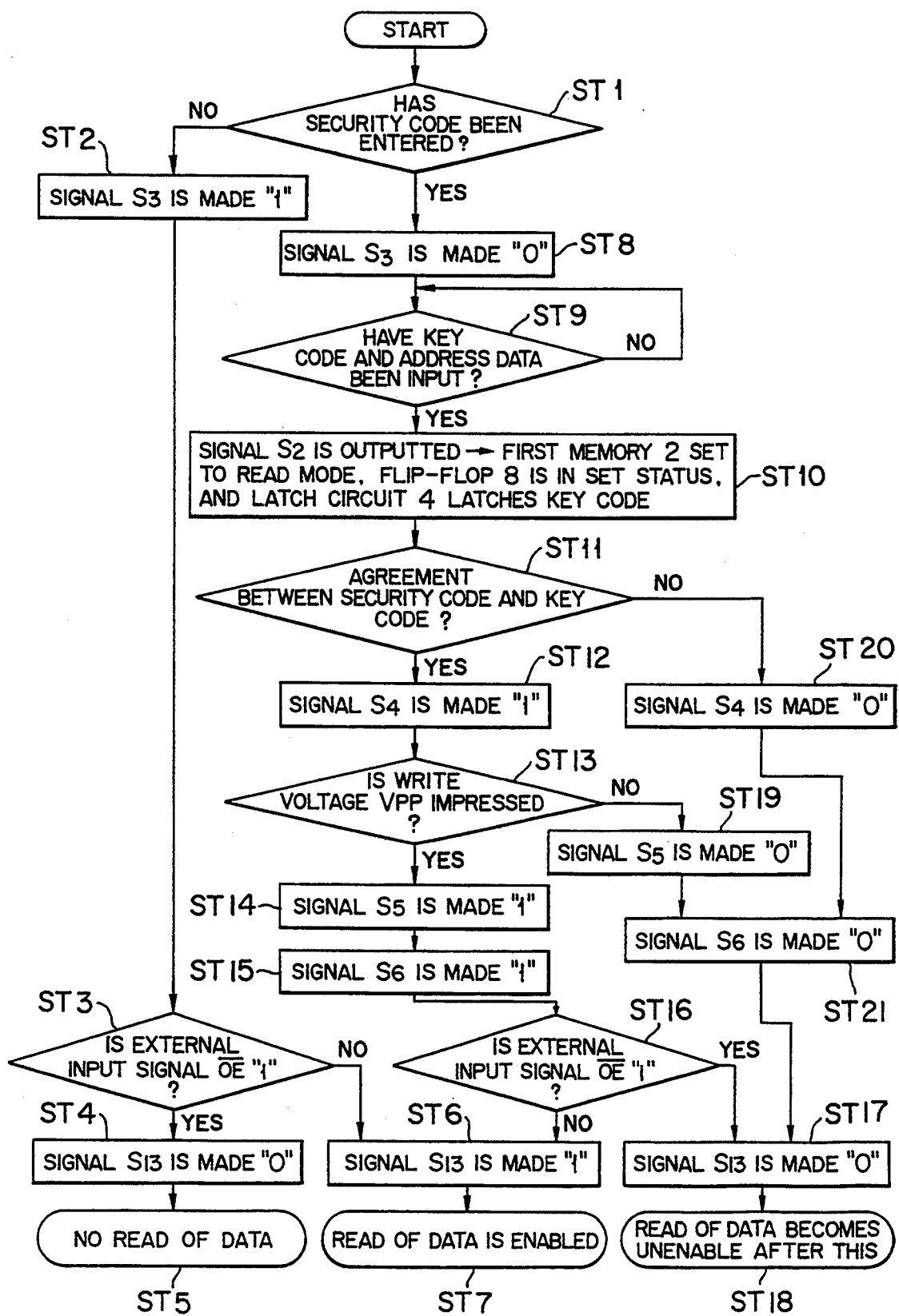
FIG. 2 is a flow chart for describing the operation of the security circuit shown in FIG. 1.

The following is a description of the configuration and operation of the present embodiment, with reference to FIG. 1 and FIG. 2.

First, when security has not been applied, that is, when the security code has been inputted, the step ST1 in FIG. 2 becomes NO, and the signal $S_3$ that is sent from the first memory 2 to the OR circuit 22 of the read control circuit 20 becomes the "1" status (refer to step ST2). At this time, the signal $S_{13}$ (shown in FIG. 1) that controls the reading of the data stored in the internal memory (EPROM) not indicated in the figure, is output in accordance with the externally applied output control signal $\overline{OE}$ (step ST3 and step ST4). More specifically, when the signal $\overline{OE}$ is "1", the output of the NOT circuit 23 becomes "0" and accordingly, the signal $S_{13}$ that is the output of the AND circuit 23 becomes "0" and reading of data from the internal memory (EPROM) not indicated in the figure is performed. Also, when the signal $\overline{OE}$ is "0", the output of the NOT circuit 23 becomes "1" and so the read enable signal which is the output of the AND circuit 24 becomes "1" (step ST6) and it is possible to read the data from the memory not indicated in the figure (step ST7).

The following is a description of the case when security is applied i.e., when a security code has been entered. When the security code and the address of the memory 2 are input (YES for step ST1), the signal $S_1$ sent from the address decoder 30 to the first memory 2 becomes "0" and the first memory 2 enters the status where data writing is possible. The security code is sent to the first memory 2 via the data bus and stored. When this occurs, the signal $S_3$ sent from the memory 2 to the OR circuit 22 of the read control circuit 20 becomes "0" (step ST8).

After the security code has been input in this manner, and the data that are stored in the memory (not indicated in the figure) internal to the microcomputer or the like are to be read, it is necessary to input the security code and the address of the latch circuit 4. Accordingly, this is judged in step ST9. When the key code and the address of the latch circuit 4 are input, the signal $S_2$ is sent from the address decoder 30 to the first memory 2, the latch circuit 4, and the flip-flop 8. The first memory 2 enters the read mode, the flip-flop 8 enters the set status and the key code is latched to the latch circuit 4 (step ST10).

Then, the security code that is stored in the memory 2 and the key code that is latched to the latch circuit 4 are compared in the comparator circuit 6 (step ST11) and if they are in agreement, the signal $S_4$ that is sent from the comparator circuit 6 to the AND circuit 7 becomes "1" (step ST12) and "0" (step ST20) if they are not in agreement. The signal $S_5$ that is sent on the external write voltage line to the AND circuit 7 becomes "1" when the write voltage $V_{pp}$ is impressed (step ST14) and becomes "0" when the write voltage $V_{pp}$ is not impressed (step ST19). Accordingly, in step ST13, the write voltage $V_{pp}$ is determined as to whether or not it is impressed.

The following will consider the case when the signal $S_5$ is "1" and the security code and the key code are in agreement, that is, the case for when the signal $S_4$ is "1". When this occurs, the output signal $S_6$ of the AND circuit 7 becomes "1" (step ST15) and the output signal $S_7$ of the NOT circuit 9 becomes "0". By this, the output signal $S_9$ of the NAND circuit 10 becomes "1" and writing to the second memory 12 is performed. Moreover, the output signal $S_8$ of the flip-flop 8 is in the set status and is therefore "1". The signal $S_{10}$ sent from the memory 12 to the AND circuit 21 of the read control circuit 20 is "1" and so the signal $S_{11}$ sent from the AND circuit 21 to the OR circuit 22 becomes "1". Accordingly, the read enable signal $S_{13}$ which is the output of the read control circuit 20 is in accordance with the output control signal $\overline{OE}$ that is externally applied. Judging step ST16 is the same as step ST13, so that the external input signal $\overline{OE}$ is judged whether or not it is in the read. Namely, when the signal $\overline{OE}$ is not "1", the signal $S_{13}$ becomes "1" (step ST6), and it is possible to read the data that stored in the memory (EPROM) not indicated in the figure (step ST7). Moreover, when step ST16 is determined to be YES the signal $S_{13}$ becomes "0" (step ST7), and it is impossible to read the data after this.

On the other hand, when there is not agreement between the key code and the security code when the two are compared by the comparator circuit 6 (NO for step ST11), the signal $S_4$ becomes "0", (step ST20), an output signal $S_6$ of the AND circuit 7 becomes "0" (step ST21). Then, an output signal $S_7$ of the NOT circuit 9 becomes "1". Also, since the signal $S_8$ becomes "1", an output signal $S_9$ of the NAND circuit 10 becomes "0" and is written to the second memory 12. When there is a write to the memory 12, the signal $S_{10}$ becomes "0" and so the output signal $S_{11}$ of the AND circuit 21 becomes "0". Also, the security code is stored in the first memory 2 and so the signal $S_3$ also becomes "0" and so the output signal $S_{12}$ of the OR circuit 22 also becomes "0". Accordingly, the read enable signal $S_{13}$ that is the output of the read control circuit 20 is always "0" and reading of the data that is stored in the memory (EPROM) internal to the microcomputer or the like is not possible for as long as the data in the memory 12 is not erased (step ST18). Moreover, if the data in the memory 12 is erased, then the memory for which reading was prohibited, that is, the data in the memory internal the microcomputer or the like is also erased at the same time and security is ensured.

As has been described above, according to the present embodiment, it is possible for the user who has applied security to read the data that is stored in the memory but it is not possible for this data to be read by other users. Normal reading is also not possible when an erroneous security code has been input.

Accordingly, with the present invention, it is possible for the user who has applied security to read the data that is stored in the memory but it is not possible for this data to be read by other users. Also, normal reading is not possible after an erroneous security code has been input.

What is claimed is:

1. A security circuit for protecting data which are stored in an internal memory of a microcomputer, comprising:
   first memory means for storing an externally applied security code;
   latch means for latching a key code which is supplied in order to read said data stored in said internal memory;
   comparator means for comparing said security code stored in said first memory means with said key code latched by said latch means, and for outputting comparison results indicating a status of agreement thereof;
   second memory means for storing said comparison results; read control means for prohibiting reading of data from said internal memory when said comparison results indicate said security code and said key code are not in agreement such that after said prohibiting, data cannot be read from said internal memory again, and for permitting reading of data in accordance with a status of an externally applied output control signal when there is agreement between said security code and said key codes; and
   a set-reset flip-flop receiving said signal for directing latching of said key code on a set terminal thereof, and receiving an external reset signal on a reset terminal thereof.

2. The security circuit according to claim 1, wherein said first and second memory means are each comprised of an electrically programmable read only memory (EPROM).

3. The security circuit according to claim 1, wherein said security circuit is connected with a data bus for transferring said security code to said first memory means and said key code to said latch means, respectively.

4. The security circuit according to claim 1, further comprising an address decoder which is connected with an address bus wherein said address decoder supplies to said first memory means a signal for directing writing of said security code, and supplies to said latch means a signal for directing latching of said key code, respectively.

5. A security circuit for protecting data stored in an internal memory of a microcomputer, the circuit comprising a data bus for transferring a security code and a key code inputted from an input device;

an address bus for transferring address data inputted from said input device;

a first EPROM for storing said security code inputted through said data bus;

a latch circuit for latching said key code inputted by a user through said input device in order to read out said data stored in said internal memory;

a comparator circuit for determining whether or not there is agreement between said security code stored in said first EPROM and said key code latched by said latch circuit;

an address decoder for generating a signal which causes said first EPROM to store said security code and a signal which causes said latch circuit to store said key code in response to said address data inputted through said address bus;

a set-reset flip-flop having a reset terminal to which an external reset signal is inputted, and a set terminal to which a signal from said address decoder is inputted;

a second EPROM for storing said comparison results in response to an output from said flip-flop, when said comparison results of said comparator circuit indicates agreement of said security code and said key code; and a read control circuit, which on the basis of said comparison results stored in said second EPROM prohibits reading data stored in said internal memory when there is no agreement between said security code and said key code, and enables reading said data stored in said internal memory in accordance with an externally applied output control signal when there is agreement between said security code and said key code.

6. A method of protecting data stored in an internal memory of a microcomputer, the method comprising the steps of:

storing an externally applied security code in a first memory means;

latching in a latch means a key code which is input in order to read said data stored in said internal memory;

determining with a comparator whether or not said security code stored in said first memory means and said key code latched by said latch means are in agreement, and outputting comparison results;

storing said comparison results in a second memory means; prohibiting reading of data stored in said internal memory when said comparison results indicate that said security code and said key code are not in agreement, and when there is agreement controlling reading data stored in said internal memory with an externally applied output control signal; and wherein a set-reset flip-flop receives a signal for directing latching of said key code on a set terminal thereof, and receives an external reset signal on a reset terminal thereof.

7. The method according to claim 6, wherein said first and second memory means are each comprised of an electrically programmable read only memory (EPROM).

8. The method according to claim 6, wherein said security code is transferred through a data bus to said first memory means and said key code is transferred to said latch means, respectively.

9. The method according to claim 6, wherein an address decoder is connected with an address bus and supplies to said first memory means a signal for directing writing of said security code, and to said latch means a signal for directing latching of said key code.

* * * * *